United States Patent
Nakajyo et al.

(10) Patent No.: US 6,777,250 B1
(45) Date of Patent: Aug. 17, 2004

(54) MANUFACTURE OF WAFER LEVEL SEMICONDUCTOR DEVICE WITH QUALITY MARKINGS ON THE SEALING RESIN

(75) Inventors: Shinsuke Nakajyo, Akiruno (JP); Yoshiyuki Yoneda, Akishima (JP); Hideharu Sakoda, Kunitachi (JP)

(73) Assignee: Fujitsu Limited, Kawasaki (JP)

( * ) Notice: Subject to any disclaimer, the term of this patent is extended or adjusted under 35 U.S.C. 154(b) by 69 days.

(21) Appl. No.: 09/686,958

(22) Filed: Oct. 12, 2000

(30) Foreign Application Priority Data

Jul. 3, 2000 (JP) ....................................... 2000-201416

(51) Int. Cl.⁷ .............................................. H01L 21/66
(52) U.S. Cl. .......................... 438/14; 438/17; 438/114; 438/465
(58) Field of Search .............................. 438/14, 15, 17, 438/110, 113, 114, 460, 462, 465, 106, 127, 112, 124, 401, 107; 347/362; 324/765; 257/787; 361/760

(56) References Cited

U.S. PATENT DOCUMENTS

| | | | | |
|---|---|---|---|---|
| 4,607,219 A | * | 8/1986 | Isosaka ........................ | 324/769 |
| 4,967,146 A | * | 10/1990 | Morgan et al. ................ | 257/48 |
| 5,838,361 A | * | 11/1998 | Corbett ........................ | 347/262 |
| 6,228,676 B1 | * | 5/2001 | Glenn et al. ................. | 438/106 |
| 6,228,684 B1 | * | 5/2001 | Maruyama .................... | 438/113 |
| 6,358,776 B1 | * | 3/2002 | Takehara et al. ............. | 438/106 |
| 6,420,790 B1 | * | 7/2002 | Koizumi ....................... | 257/787 |
| 6,432,796 B1 | * | 8/2002 | Peterson ....................... | 438/401 |
| 6,511,620 B1 | * | 1/2003 | Kawahara et al. .......... | 264/40.5 |
| 6,515,347 B1 | * | 2/2003 | Shinma et al. ............... | 257/620 |
| 6,589,801 B1 | * | 7/2003 | Yoon et al. .................... | 438/15 |
| 2002/0016013 A1 | * | 2/2002 | Iketani ......................... | 438/15 |

FOREIGN PATENT DOCUMENTS

| | | | | |
|---|---|---|---|---|
| JP | P2001-135658 A | * | 5/2001 | ........... H01L/21/56 |
| JP | 2001-135658 | * | 5/2001 | ........... H01L/21/56 |

* cited by examiner

*Primary Examiner*—Richard Elms
*Assistant Examiner*—Christian D. Wilson
(74) *Attorney, Agent, or Firm*—Armstrong, Kratz, Quintos, Hanson & Brooks, LLP

(57) ABSTRACT

A method of manufacturing semiconductor device in the method of manufacturing wafer level semiconductor device that can search the defective products from the marking information even when sealing resin is formed on the wafer and a semiconductor device manufactured with the same method. A method of manufacturing wafer level semiconductor comprises a process to seal with a resin material the surface of wafer having the front surface and rear surface and forming a plurality of semiconductor chips on the front surface, a first marking process for marking the position information corresponding to each chip to the region of each chip at the rear surface of the wafer, a process for performing the electrical test to each chip, a second marking process for marking the result of the electrical test to the region of each chip at the rear surface of the wafer and a dicing process for dicing the wafer to each chip.

5 Claims, 5 Drawing Sheets

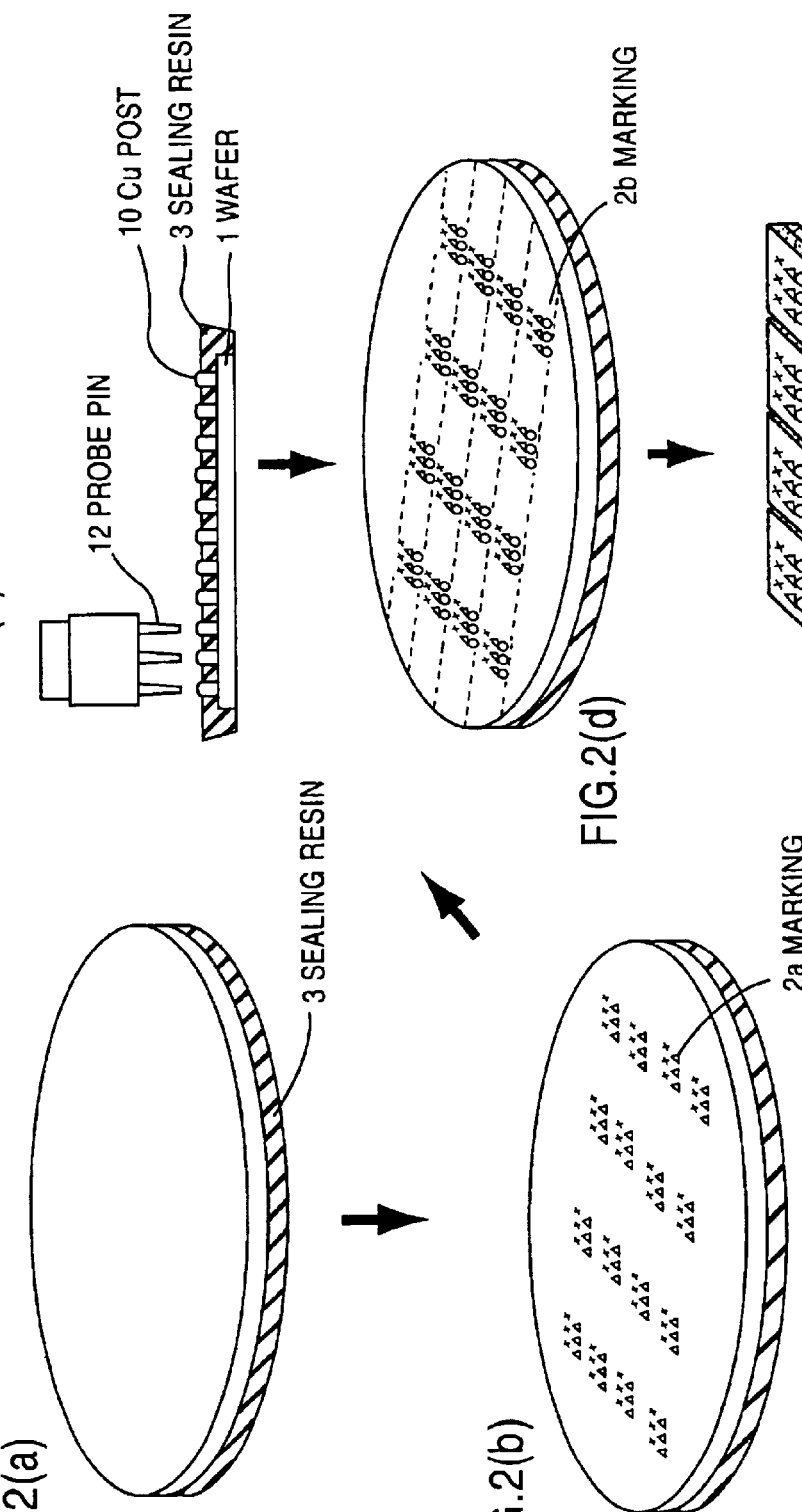

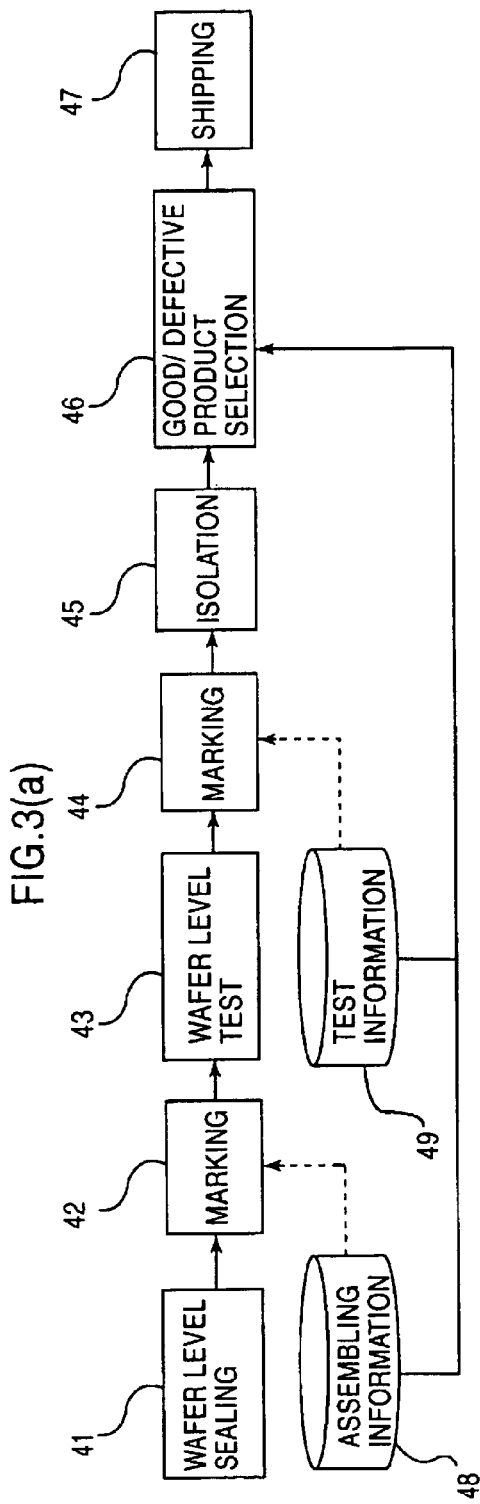
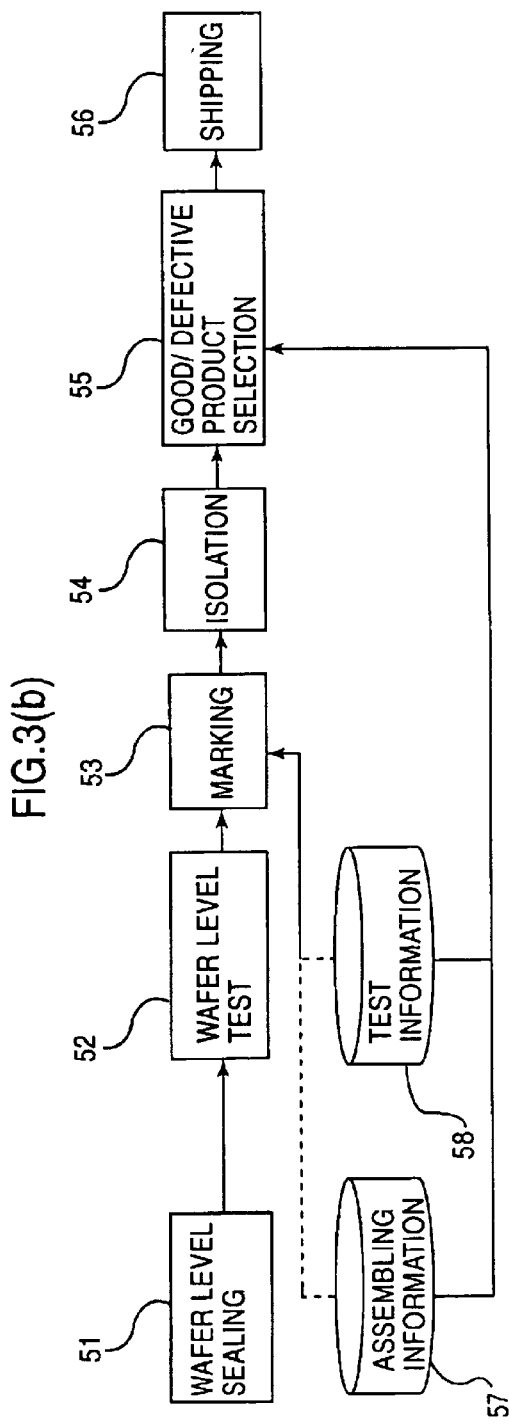

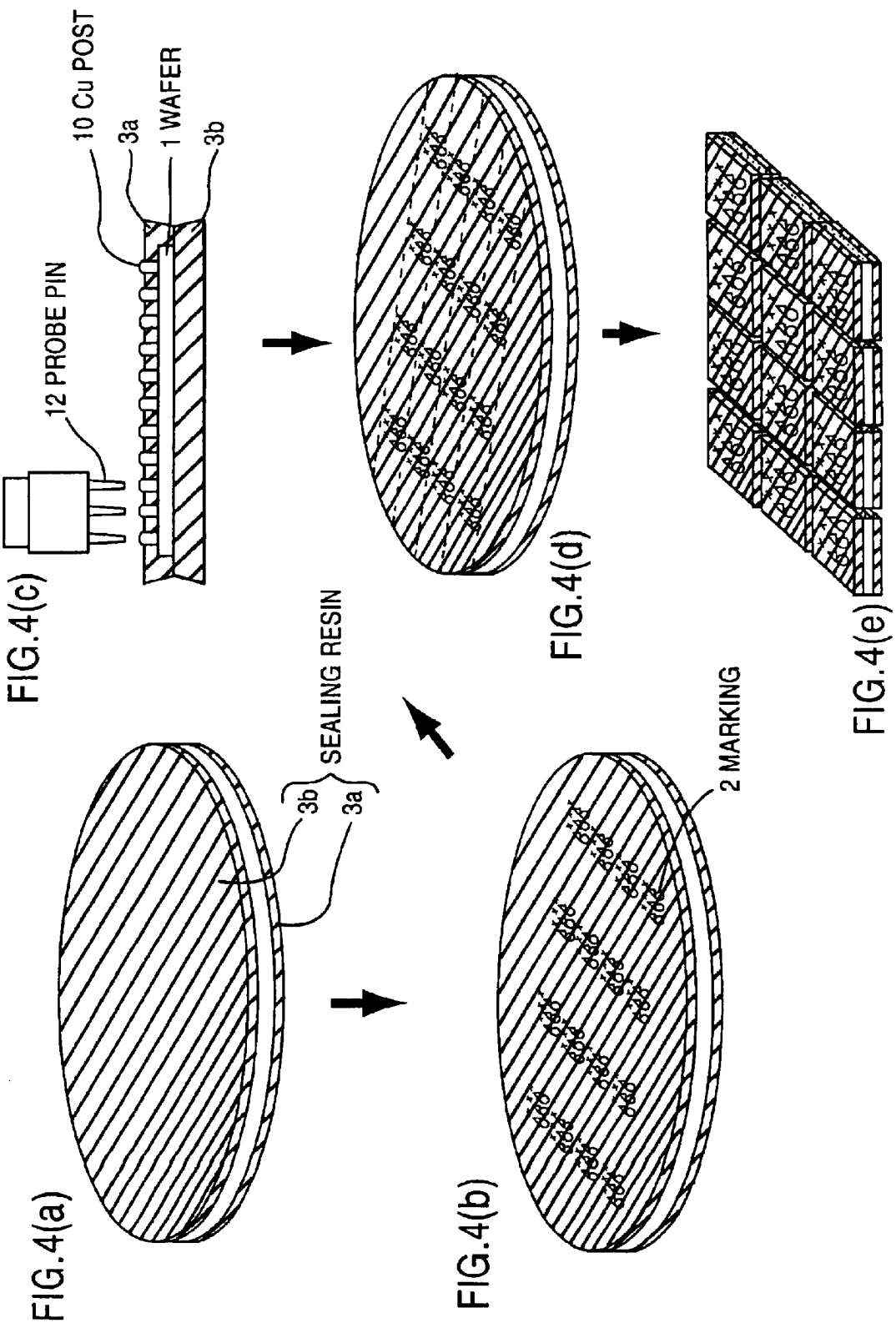

MANUFACTURE OF WAFER LEVEL SEMICONDUCTOR DEVICE WITH QUALITY MARKINGS ON THE SEALING RESIN

DETAILED DESCRIPTION OF THE INVENTION

BACKGROUND OF THE INVENTION

The present invention relates to a method of manufacturing wafer level semiconductor device and a semiconductor device wherein a plurality of chips and chip size packages (hereinafter referred to as CSP) are formed on the wafer and substrate.

There has been proposed a semiconductor package having the structure that an external output terminal formed of a projected electrode is provided on a chip, in order to provide the shape of semiconductor package sealed with resin closely to a semiconductor element (hereinafter referred to as chip) as much as possible, at least the side surface of projected electrode is sealed with resin under the wafer condition and thereafter each chip is diced. (Japanese Published Unexamined Patent Application No. HEI 10-79362; U.S. patent application Ser. No. 09/029,608)

The present invention relates to a method for providing manufacturing history used to conduct failure search of such wafer level semiconductor device and a semiconductor device manufactured using such method.

Information including manufacturer name, type, manufacturing lot or the like has been marked on the resin of a semiconductor device surface in the semiconductor device of the type other than the wafer level semiconductor device, namely the semiconductor package after the dicing and resin sealing. If a failure has occurred, history of manufacturing lot can be searched from this marking information and thereby cause of fault can be identified effectively.

The similar information is also marked in the wafer level semiconductor device of the related art.

In manufacture of semiconductor device using wafer including wafer level semiconductor device, manufacturing processes are all performed under the wafer condition but a fault is sometimes generated from the particular position on the wafer. In this case, it is required to detect where a fault is generated on the wafer but since no marking is conducted on the chip in the manufacturing method of the related art, it is impossible to identify where a fault has occurred on the wafer.

Even if marking is conducted on the chip, it is required to execute the process to melt the resin and it is considerably complicated to confirm the marking after the sealing with resin.

BRIEF SUMMARY OF THE INVENTION

Therefore, it is an object of the present invention to provide a method of manufacturing semiconductor device in the method of manufacturing wafer level semiconductor device where a fault can be searched from the marked information even after the sealing resin is formed on the wafer and a semiconductor device manufacturing with such semiconductor device manufacturing method.

The object of the invention is achieved by a method of manufacturing wafer level semiconductor device, comprising sealing process for sealing, with resin material, the front surface of a wafer having the front and rear surfaces and having formed a plurality of semiconductor chips on the front surface, first marking process for marking the position information corresponding to each chip in the region of each chip at the rear surface of the wafer, process for conducting electrical test to each chip, second marking process for marking the result of the electrical test corresponding to each chip in the region of each chip at the rear surface of the wafer, and dicing process for dicing each chip.

Further, the object of the invention is achieved by a method of manufacturing wafer level semiconductor device comprising sealing process for sealing, with resin material, the front surface of a wafer having the front and rear surfaces and having formed a plurality of semiconductor chips on the front surface thereof, process for conducting electrical test to each chip, marking process for marking, in the region of each chip at the rear surface of the wafer, the position information corresponding to each chip and the result of the electrical test, and dicing process for dicing each chip.

Further, the object of the invention is achieved by a method of manufacturing wafer level semiconductor device comprising sealing process for sealing, with resin material, the front surface of a wafer having the front and rear surfaces and having formed a plurality of semiconductor chips on the front surface, attaching process for attaching, to the rear surface of wafer, a resin sheet on which marking is made on the wafer to indicate position of each chip and dicing process for dicing each chip.

Further, the object of the invention is achieved by a semiconductor device comprising a semiconductor chip diced from the predetermined position of wafer wherein circuits are formed at the front surface, a resin sealing the front surface of the semiconductor chip, an external output terminal exposed from the resin and connected with the circuits, and a marking provided at the rear surface of the semiconductor chip to indicate the predetermined position of the wafer.

Further, the object of the invention is achieved by a semiconductor device comprising a semiconductor chip diced from the predetermined position of a wafer where circuits are formed at the front surface, a resin for sealing the front surface of the semiconductor chip, an external output terminal exposed from the resin and connected to the circuit, resin sheet attached to the rear surface of the semiconductor chip and a marking for indicating the predetermined position of the wafer printed on the resin sheet.

Each means described above includes following operations.

According to the first manufacturing method described above, resin sealing and electrical test are performed under the wafer condition without dicing individual chips from the wafer and therefore wafer manufacturing record can easily be corresponding to the chip manufacturing record. Moreover, marking can be made in the wafer condition before individual chips are diced into each chip. Therefore, when the manufacturing information is described at the time of marking, the chip manufacturing record is also left together with the position information on the wafer of chip to individual chip after the dicing in such a case that the manufacturing information is described at the time of marking. Thereby, if a defective product is generated, the cause may be searched easily and trace-ability can be improved.

According to the second manufacturing method described above, since the marking of position information can be executed in the same process as the marking of the result of electrical test, effective marking may be realized by attempting twice the marking process as described in the first method.

According to the third manufacturing method described above, since the resin sheet is used, the semiconductor package on which at least position information is marked can be structured only by attaching the resin sheet and the making can be done within a short period of time.

According to the first semiconductor device as described above, the information suggesting where the chip in the semiconductor package is located during the manufacturing process is marked and the manufacturing location record is left and therefore if a fault is generated, the cause of such fault may be searched easily and thereby trace-ability can be improved.

According to the second semiconductor device as described above, since the resin sheet is used in addition to the operation effect similar to that of the first device, the semiconductor package on which the position information is marked can be obtained at a low price.

BRIEF DESCRIPTION OF THE DRAWING

The object and advantages of the invention will become apparent and more readily appreciated from the following description of the preferred embodiments, taken in conjunction with the accompanying drawing of which:

FIG. 2 is a diagram for explaining the manufacturing process of the first embodiment of the present invention.

FIG. 3 is a diagram for explaining the manufacturing process of the first and second embodiments of the present invention.

FIG. 4 is a diagram for explaining the manufacturing process of the third embodiment of the present invention.

DETAILED DESCRIPTION OF THE PREFERRED EMBODIMENTS

Next, a preferred embodiment of the method of manufacturing wafer level semiconductor device of the present invention will be explained with reference to FIG. 1 to FIG. 5.

The wafer level semiconductor device used in the present invention provides an external output terminal formed of a projected electrode composed of Cu or the like to the electrode on each chip of wafer and is resin-sealed at its side surface of at least projected electrode under the wafer condition. Moreover, the wafer level semiconductor device of the present invention forms a plurality of chip at the surface thereof by the well known wafer process and those where a plurality of CSPs are formed on the substrate and these are resin-sealed at a time are also included in the wafer level semiconductor device.

(First Embodiment)

Figure 1A:
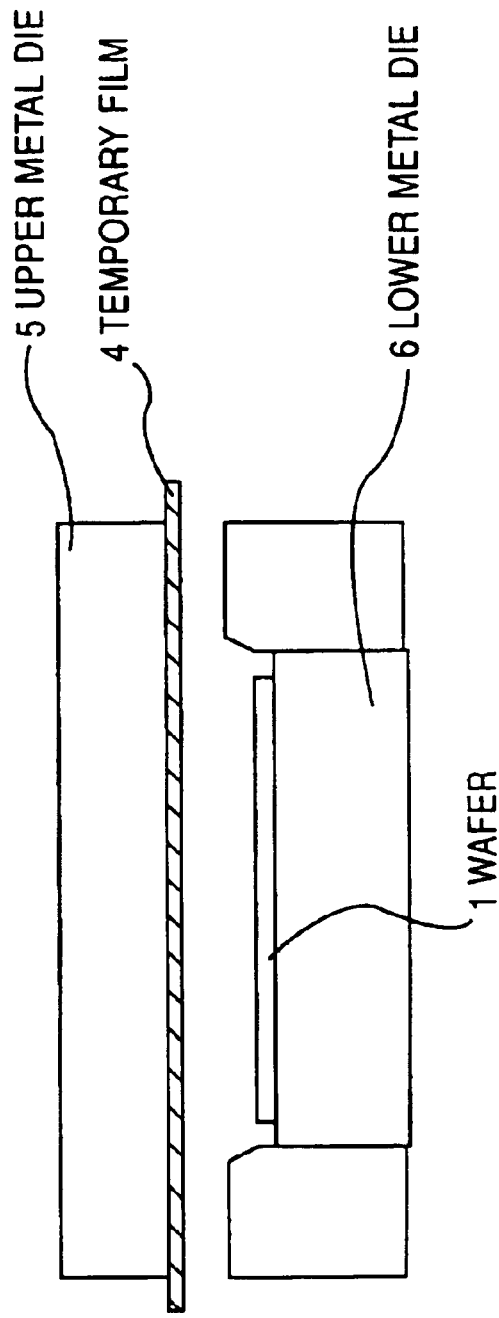
FIG. 1 is a diagram for explaining the manufacturing process of the first embodiment of the present invention.
Figure 1B:
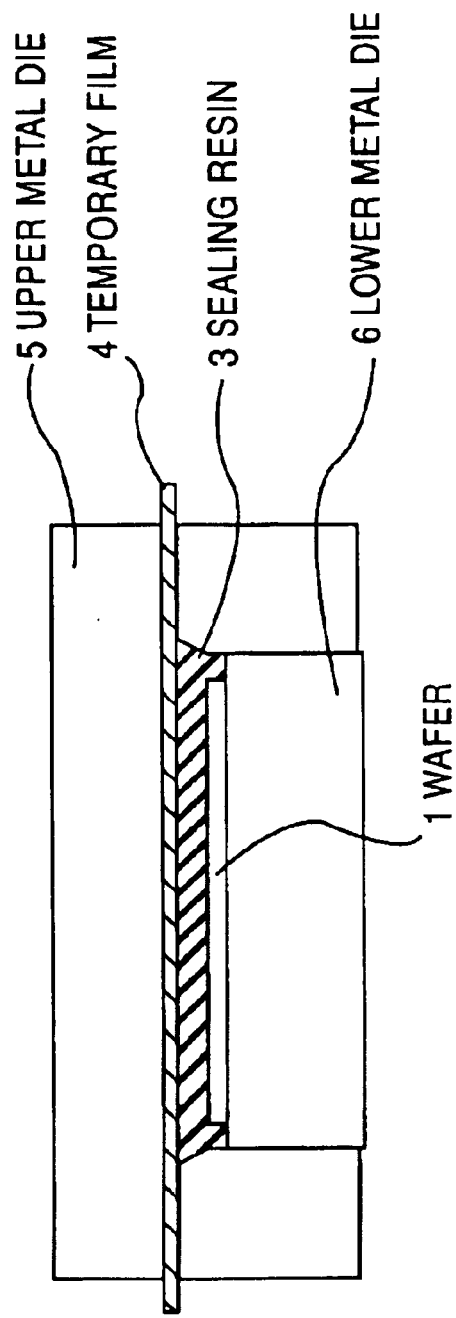

FIGS. 1(a) and 1(b) are diagrams for explaining the first embodiment of the present invention indicating the resin sealing process of the wafer level semiconductor device of the first embodiment.

In these figures, numeral 1 designates a semiconductor wafer where a plurality of CSPs or ordinary chips are formed. In more detail, this semiconductor wafer is disclosed in the Japanese Published Unexamined Patent Application No. HEI 10-79362.

On the chip or CSP formed on the wafer 1, pad electrodes are formed and the projected electrode (hereinafter called a post) is formed thereon as the external output terminal formed of copper or the like. On the circuit surface of wafer 1, the sealing resin is formed to protect the chip formed on the wafer surface.

The sealing resin is formed in the following processes.

As illustrated in FIG. 1(a), the wafer 1 is placed in the cavity formed of an upper metal die 5 and a lower metal die 6. This cavity is formed a little larger than the wafer in size. The sealing resin is formed on the wafer by compression molding of the resin between the upper metal die 5 and lower metal die 6. But, a temporary film 4 is provided in the upper metal die to easily separate the metal dies on the occasion of taking the wafer from the metal dies.

FIG. 1(b) illustrates the process to form a sealing resin 3 to the wafer set in the metal dies of (a) through the compression mold of resin.

In order to mold the sealing resin 3, a resin tablet (not illustrated) is placed first at the center of wafer, pressure is then applied to the upper and lower metal dies under application of heat, and the resin tablet is widened on the wafer 1 to conduct the compression mold. Thereby, the sealing resin 3 is formed covering the circuit surface and side surface of the wafer. In place of the compression mold explained above, the resin sealing can be realized also using the ordinary transfer mold.

Next, the process to conduct marking, test and dicing to the wafer having completed the resin sealing will be explained with reference to FIGS. 2(a) to 2(d) and FIG. 3(a).

FIG. 2(a) illustrates the wafer under the condition having completed the resin sealing explained above. The marking of position information is performed in the process (b) to the region of each chip at the rear surface of chip for the rear surface 3 of the wafer in the opposite side of the circuit surface of this wafer to form the marking 2a. These processes correspond to the steps 41, 42 illustrated in FIG. 3(a).

Position information indicates where the chip to be marked is located on the wafer. For example, when the virtual X-Y axis is provided to the wafer and the numerals corresponding to such coordinates are marked, the position information on the wafer can be indicated in each chip.

In addition to the marking of the position information, the basic information including type of product, lot number and manufacturing week can also be marked here.

Moreover, this information can be marked based on the assembling information stored in an assembling information storage memory 48 (FIG. 3(a)) in regard to the fault generated at the time of resin sealing. This assembling information includes the position information indicating where the partial fault of sealing resin generated at the time of compression mold is located on the wafer.

The mark 2 may be printed using the laser. The YAG laser or green laser is used and output of this laser is set to 300 to 500 mW.

Next, as illustrated in FIG. 3(c), electrical test is performed in the wafer level for each chip. Chip test is conducted by placing the probe pin 12 in contact with the Cu post 10 as the external electrode formed on each chip. The probe pin 12 may be placed in contact in unit of several pins and placed simultaneously with all pins of the chip. Moreover, the probe pin 12 maybe placed in contact with a plurality of chips or the wafer contactor may be used for simultaneous contact to all wafers. These processes correspond to the step 43 illustrated in FIG. 3(a).

Electrical test is performed to confirm whether the internal circuit functions in correct or not for each chip and the burn-in test may also be performed as required under the predetermined temperature environment.

Result of this electrical test is stored in the test information storage memory 49. In this case, data of good product is stored together with the position information to form the good product map data.

Thereafter, as illustrated (d), result of the electrical test is marked in the region of each chip at the rear surface of the wafer to form the mark 2b. This process corresponds to the step 44 illustrated in FIG. 3(a).

Result of this test may be performed to indicate good product or defective product or to indicate only the good product. Moreover, this marking may be performed for the good product in the predetermined ranks.

Finally, as illustrated in (d), dicing is conducted for each chip using a dicing saw and as illustrated in (e), individual semiconductor package can be obtained. Only the good product of the semiconductor package are selected and delivered on the basis of the marked information explained above. These processes correspond to the steps 45, 46, 47 illustrated in FIG. 3(a).

For this selection, the good product map data explained above is used and selection of only good product can be traced for confirmation by referring to the map data based on the position information within the wafer. Moreover, the defective product may be discriminated easily by giving thereto the marking that enables visual discrimination from the good product.

As explained above, since the resin sealing and electrical test are performed under the wafer condition without dicing of each chip from the wafer, the wafer manufacturing record may be easily set to correspond to the chip manufacture record. Moreover, according to the present embodiment, marking can be done under the wafer condition before each chip is isolated with the dicing process. Therefore, when the manufacturing information is described at the time of marking process, the chip manufacturing record is also left together with the position information on the wafer of individual chip after the dicing process and thereby the cause may easily be traced if a fault is generated, thus improving the trace-ability in the failure search.

(Second Embodiment)

FIG. 3(b) is a diagram illustrating the second embodiment of the present invention.

Difference from FIG. 3(a) lies in that the marking of position information is not performed before the electrical test 52 in the wafer level but after this test.

As explained above, in this embodiment, since the marking of the position information and marking of the result of electrical test are conducted in the same process, this marking can be realized more effectively than the two times of markings as illustrated in FIG. 3(a).

(Third Embodiment)

FIG. 4 is a diagram illustrating the third embodiment of the present invention.

This embodiment suggests the sealing of both surfaces of the wafer with the resin 3a, 3b as illustrated in FIG. 2.

As illustrated in (a), the circuit surface side is sealed with the resin 3a, while the opposite surface with the resin 3b. This sealing process can be conducted by conducting twice the method explained in FIG. 1 through upside down of the wafer.

Next, as illustrated in (b), the marking of position information is performed to the resin 3b in the opposite side of the circuit surface as in the case of the first embodiment to form the mark 2.

Next, as illustrated in (c), the electrical test is performed, as in the case of the first embodiment, by placing the probe 12 in contact with the Cu post 10 exposed from the resin 3a at the circuit surface.

Finally, as illustrated in (d), the result of electrical test is marked to the resin 3b as in the case of the first embodiment.

The remaining processes may be performed in the same manner as the first embodiment.

The marking process may be performed, as in the case of the second embodiment, by simultaneously marking both position information and result of electrical test.

As explained above, marking can be performed to the resin surface with the existing facilities for printing the mark on the resin surface by sealing the both surfaces of wafer with resin and then printing the mark on the resin surface.

(Fourth Embodiment)

Figure 5:
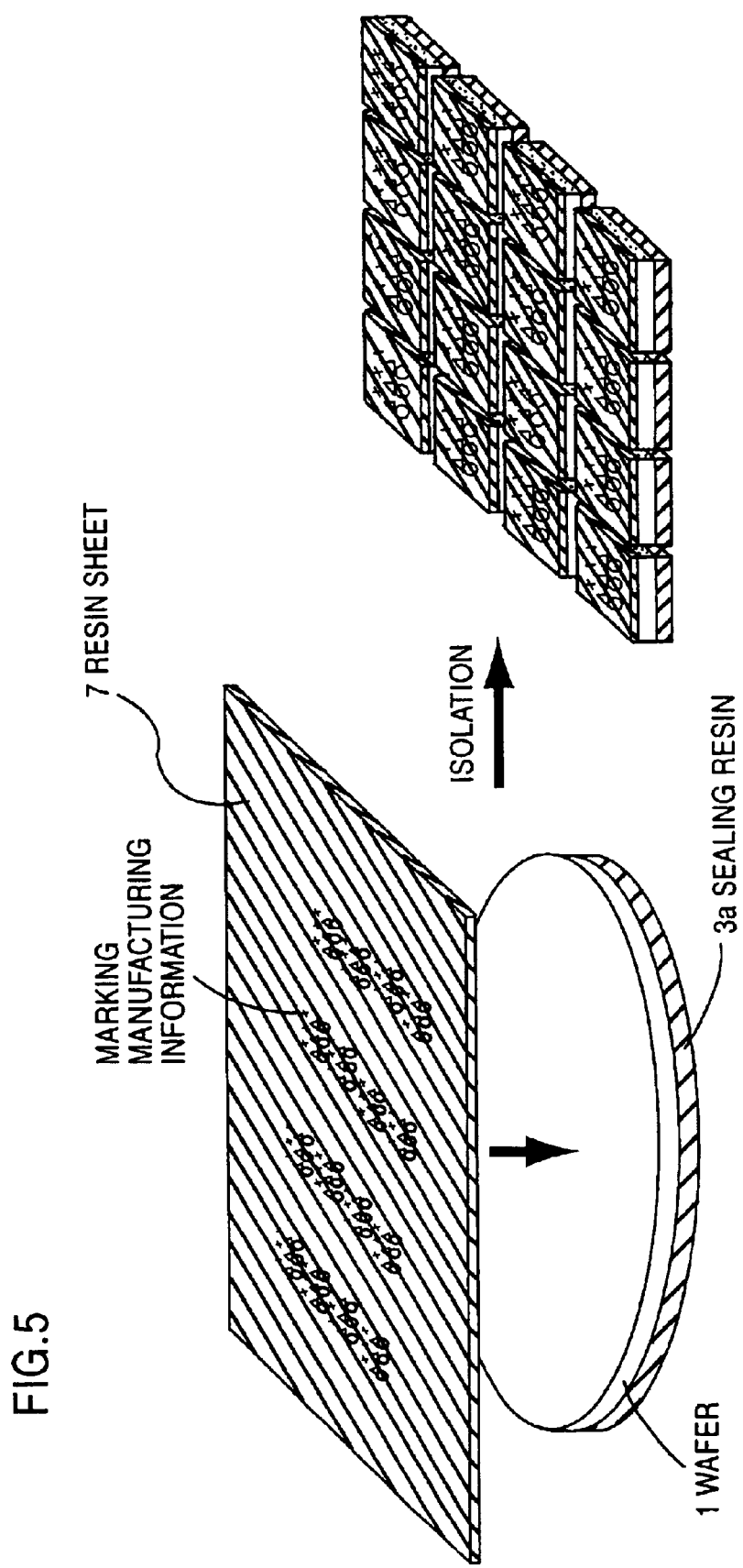
FIG. 5 is a diagram for explaining the manufacturing process of the fourth embodiment of the present invention.

FIG. 5 is a diagram for explaining the fourth embodiment of the present invention.

In this embodiment, the circuit surface and opposite surface of the wafer explained in FIG. 4 are formed of a resin sheet 7 of heat-resistant organic material, for example, polyimide.

First, the circuit surface side is sealed with the resin 3a.

Next, the position information is marked on the resin sheet 7 as in the case of the first embodiment.

Next, as in the case of the first embodiment, the electrical test is performed by placing the probe in contact with the Cu post exposed from the resin 3a of the circuit surface and the result is marked on the resin sheet 7. Thereafter, this resin sheet is attached to the opposite surface of the circuit surface of wafer. The remaining processes are performed in the same manner as the first embodiment for the dicing of wafer to each chip.

The semiconductor package having the marking can be formed only by attaching the resin sheet through the use of such resin sheet and the marking can be performed only within a short period of time.

In the marking process, it is also possible, as in the case of the second embodiment, to simultaneously mark both position information and result of electrical test on the resin sheet 7 and thereafter attach the resin sheet having the marking to the rear surface of the wafer.

Thereby, the marking information including the position information and result of electrical test is not required to temporarily print unlike the first embodiment and the result of electrical test can be marked on the resin sheet simultaneously when the test is performed.

Moreover, it is also possible to previously print the numerals and codes indicating the position information of the chip on the resin sheet and then attaching the resin sheet to the rear surface of wafer under the condition of FIG. 2(a). In this case, the result of electrical test is not printed. The result of electrical test is no longer required to print on the resin sheet in the case where such result is stored in the memory together with the position information of chip. Thereby, the marking process of the test result may be omitted and accordingly the processes may be saved.

[Effect of the Invention]

As explained above, according to the method of manufacturing wafer level semiconductor device of the present invention, since the information indicating where the internal chips are located on the wafer can be printed on the diced semiconductor package, the trace-ability of search for defective product can be very much improved.

What is claimed is:

1. A method of manufacturing wafer level semiconductor device, comprising the steps of:

sealing the front surface of a semiconductor wafer having the front and rear surfaces and having formed a plurality of semiconductor chips on the front surface with resin material;

a first marking the position information corresponding to each chip in the region of each chip at the rear surface of said semiconductor wafer;

conducting electrical test to each chip;

a second marking the result of said electrical test corresponding to each chip in the region of each chip at the rear surface of said semiconductor wafer; and dicing the semiconductor wafer into each chip.

2. A method of manufacturing wafer level semiconductor device comprising:

sealing the front surface of a semiconductor wafer having the front and rear surfaces and having formed a plurality of semiconductor chips on the front surface thereof with resin material;

conducting electrical test to each chip;

marking in the region of each chip at the rear surface of said semiconductor wafer, the position information corresponding to each chip and the result of said electrical test; and dicing the semiconductor wafer into each chip.

3. A method of manufacturing wafer level semiconductor as claimed in claim 1 or 2, wherein the circuit surface of said semiconductor wafer and the opposite surface thereof are sealed with resin material and said position information and result of electrical test are marked in the region of each chip on the surface.

4. A method of manufacturing wafer level semiconductor device comprising:

sealing the front surface of a semiconductor wafer having the front and rear surfaces and having formed a plurality of semiconductor chips on the front surface thereof with resin material;

attaching a resin sheet on which marking is made on said semiconductor wafer, to said rear surface of said semiconductor wafer to indicate position of each chip; and dicing the semiconductor wafer into each chip.

5. A method of manufacturing wafer level semiconductor device as claimed in claim 4 further comprising:

conducting electrical test to each chip; and marking the result of said electrical test corresponding to each chip to the region of each chip of the rear surface of said semiconductor wafer.

* * * * *